United States Patent [19]

Jessee

[11] Patent Number: 5,452,198

[45] Date of Patent: Sep. 19, 1995

[54] APPARATUS AND METHOD FOR A/C VOLTAGE SENSING

[75] Inventor: Ralph D. Jessee, Lima, Ohio

[73] Assignee: Sundstrand Corporation, Rockford, Ill.

[21] Appl. No.: 193,838

[22] Filed: Feb. 9, 1994

[51] Int. Cl.$^6$ ......................................... H02M 7/5395
[52] U.S. Cl. ...................................... 363/78; 363/95; 363/41
[58] Field of Search ...................... 324/74, 103 P, 775, 324/742; 363/47, 74, 78, 95, 97, 98

[56] References Cited

U.S. PATENT DOCUMENTS

| | | | |
|---|---|---|---|
| 3,781,634 | 12/1973 | Jessee | 321/9 A |
| 4,109,308 | 8/1978 | Rödel | 363/125 |
| 4,217,542 | 8/1980 | Abbe et al. | 324/57 R |
| 4,377,779 | 3/1983 | Plunkett | 318/811 |
| 4,757,434 | 7/1988 | Kawabata et al. | 363/41 |
| 4,920,472 | 4/1990 | Handler | 363/95 |
| 5,105,352 | 4/1992 | Iwasa et al. | 363/98 |

Primary Examiner—Peter S. Wong
Assistant Examiner—Shawn Riley
Attorney, Agent, or Firm—Jeffery J. Makeever

[57] ABSTRACT

An apparatus and method for generating a sensing signal from a generally periodic AC signal. The apparatus includes a first integrating circuit (125) for generating a first integrated signal by integrating the AC signal during a time period between positive transitions of the AC signal. The first integrating circuit (125) is reset by pulses from a pulse generator (100) at negative transitions of the AC signal. The apparatus further includes a second integrating circuit (135) for generating a second integrated signal by integrating the AC signal during the time period between positive transitions of the AC signal. The second integrating circuit (135) is reset by a further pulse generator at positive transitions of the AC signal. The sensing signal is generated by taking the difference in magnitude between the first and second integrated output signals.

28 Claims, 8 Drawing Sheets

APPARATUS AND METHOD FOR A/C VOLTAGE SENSING

FIELD OF THE INVENTION

The present invention relates to the AC voltage sensing. More specifically, the present invention is directed to an apparatus and method for AC voltage sensing to generate a sensing signal for voltage control of a pulse width modulated inverter.

BACKGROUND OF THE INVENTION

Pulse width modulated inverters are usually equipped with harmonic filters so that the output voltages are acceptable to the applied loads. Harmonic content is ordinarily less than 5%. The result is a sinusoidal voltage waveform output with small ripple voltages superimposed.

When various loads are applied, phase shifts in the ripple components occur such that the peak amplitude of the output voltages change as a function of applied load even though the fundamental component remains constant. This characteristic presents a problem in sensing the true average RMS value in a form usable for voltage control.

In a typical voltage-regulated inverter, the inverter output voltage is fed back to an error amplifier through a sensing signal processor which generates a sensing signal. Ideally, the sensing signal is proportional to the average or RMS amplitude of the output voltage. The sensing signal is used in conjunction with a reference signal to generate a further signal which is used to control the output voltage of the inverter. Transient or ripple errors in the sensing signal cause distortion to be transmitted through the system and ultimately effects regulation of the inverter output.

Several different methods are commonly used to generate the sensing signal. In one method, the AC voltage output of the invertor is rectified and filtered to produce the sensing signal. Sensing signals generated in this manner tend to be peak sensitive and, therefore, are sensitive to changes in the characteristics of the applied load.

In a further method, the AC voltage output of the invertor is applied to a multiplying circuit, the output of which is subsequently filtered to generate a sensing signal which represents the RMS value of the AC output voltage. While this method produces a good steady state signal, the filtering of the signal causes a delay which prevents timely response of the sensing signal to transient changes in the sensed voltage which are produced, for example, by load switching. The delay in sensing the true AC output value is transferred as an error to the voltage control circuits and thus adversely effects the inverter output transient response characteristics.

SUMMARY OF THE INVENTION

An apparatus and method for generating a sensing signal from a generally periodic AC signal are disclosed. The apparatus includes a first means for generating a first integrated signal by integrating the AC signal during a time period between negative transitions of the AC signal. The first means for generating is reset at negative transitions of the AC signal. The apparatus further includes a second means for generating a second integrated signal by integrating the AC signal during the time period between positive transitions of the AC signal. The second means for generating is reset at positive transitions of the AC signal. The sensing signal is generated by taking the difference in magnitude between the first and second integrated output signals.

BRIEF DESCRIPTION OF THE DRAWINGS

Other objects and features of the present invention may be further understood by reference to the following detailed description of the preferred embodiments of the invention taken in conjunction with the accompanying drawings, on which.

It will be understood that the drawings are not necessarily to scale. In certain instances, details which are not necessary for understanding various aspects of the present invention have been omitted for clarity.

DESCRIPTION OF THE PREFERRED EMBODIMENTS

Figure 1:
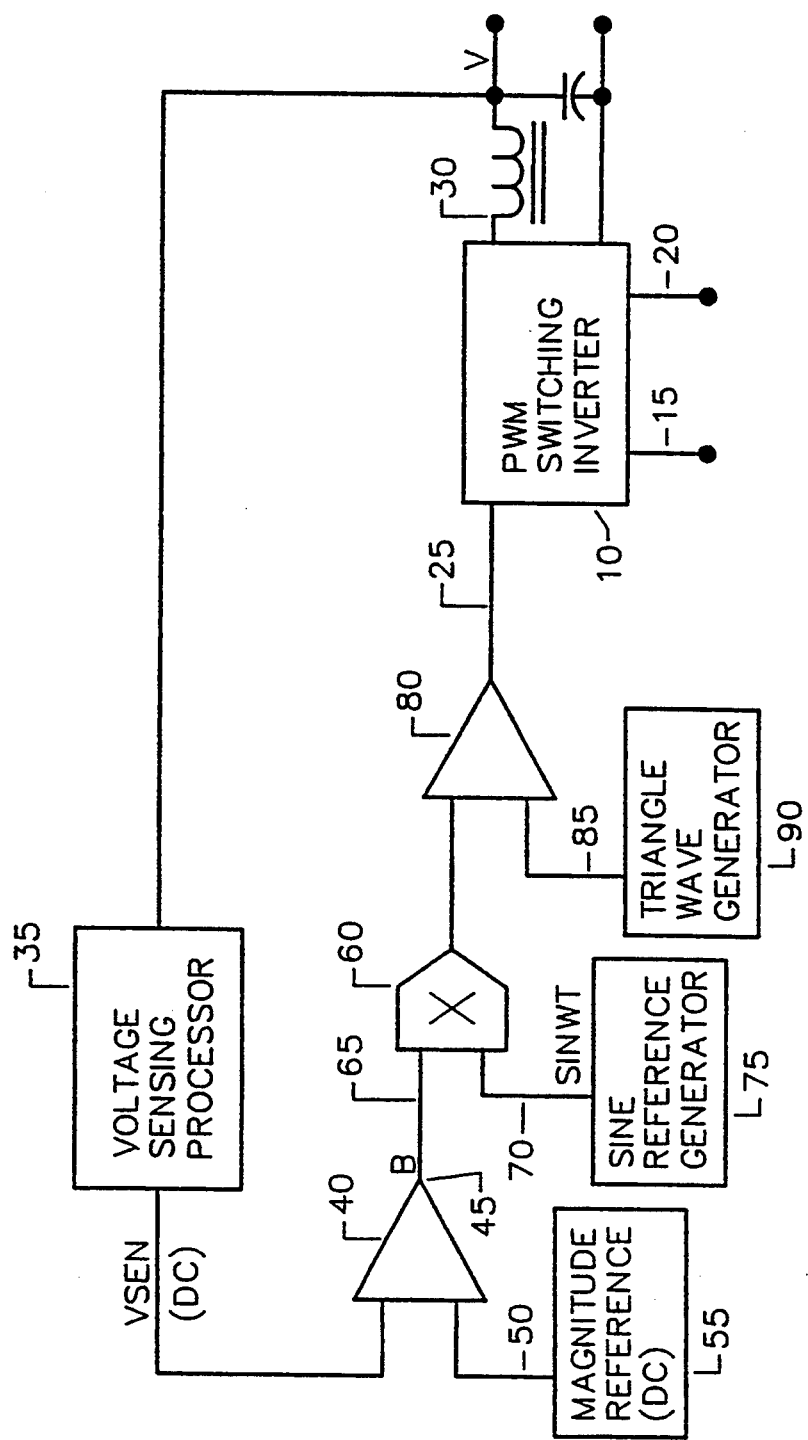
FIG. 1 is a schematic block diagram of an inverter system which may employ a sensing processor constructed in accordance with the present invention.

FIG. 1 is a schematic diagram of an inverter system. The system includes a pulse width modulated (PWM) inverter circuit 10 having DC inputs 15 and 20, a pulse input 25 for receiving a pulse width modulated signal, and an output line 30 which is used to generate an AC voltage output V. The pulse signal supplied to the input 25 controls operation of the inverter circuit 10 to regulate the AC voltage V.

The AC voltage output V is fed back to the input of a voltage sensing processor 35, the details of which will be set forth below. The voltage sensing processor 35 generates a DC sensing signal $V_{sen}$. The DC sensing signal $V_{sen}$ is representative of the amplitude of the AC signal V that is output from the inverter system. An error amplifier 40 generates a magnitude control signal B at output 45 that responds to the difference between the sensing signal $V_{sen}$ and the DC output 50 of a DC magnitude reference generator 55.

A modulator circuit 60 has a first input 65 accepting the error signal B and a second input 70 accepting a sine wave output signal Sin ωt from a sine reference generator 75. The output of the modulator 60 has a magnitude of B Sin ωt.

A comparator circuit 80 has a first input connected to accept the output of the modulator 60 and a second input 85 connected to accept a triangle wave signal output from a triangle wave generator 90. The output of the comparator circuit 80 is supplied to the pulse input 25 of the PWM inverter circuit 10 to control the generation of the AC signal output V.

Figure 2:
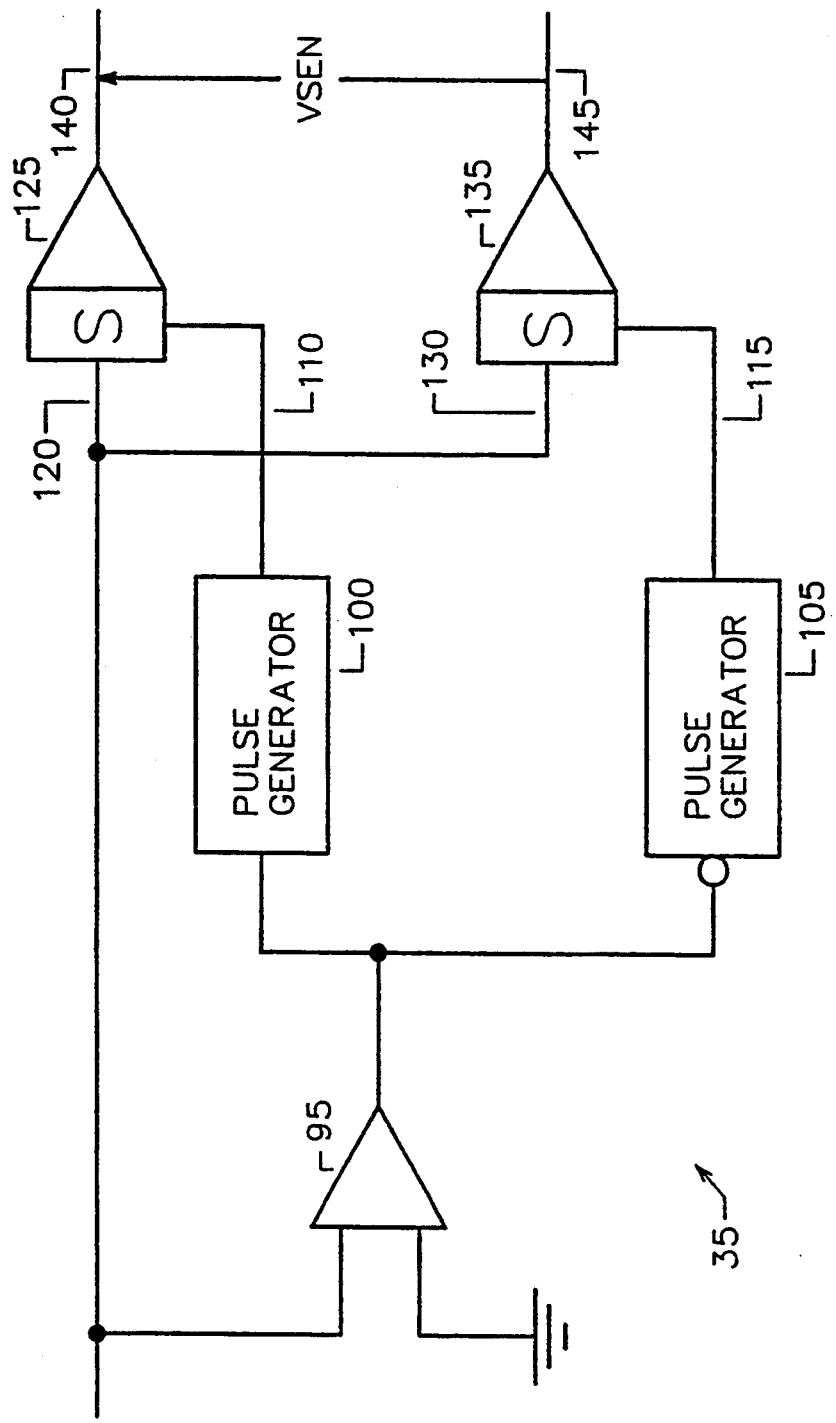
FIG. 2 is a schematic block diagram of one embodiment of a sensing processor circuit constructed in accordance with the present invention.

FIG. 2 is a schematic block diagram of one embodiment of the sensing processor circuit 35 shown in FIG. 1. The sensing processor circuit 35 includes a level detection circuit 95 having a first input connected to receive the AC signal V and a second input connected to a zero reference level. In the embodiment shown, the zero reference level is ground or 0v.

The output of the level detection circuit 95 is supplied directly the input of a first pulse generator 100 and in inverted fashion to the input of a second pulse generator 105. The first pulse generator 100 provides an output pulse on line 110 whenever the AC signal V experiences a negative going transition with respect to the zero reference level. The second pulse generator 105 provides an output pulse on line 115 whenever the AC signal V experiences a positive going transition with respect to the zero reference level.

The AC signal V is also supplied to the input 120 of a first integrating circuit 125 and the input 130 of a second integrating circuit 135. In the embodiment shown, the first and second integrating circuits 125 and 135 have identical integrating characteristics, although the integration limits differ as set forth below.

The first integrating circuit 125 accepts the output signal of the first pulse generator 100 as a reset input which resets the first integrating circuit 125 in response to pulses received from the first pulse generator 100. The first integrating circuit 125 thus only integrates the AC signal V during the interval between negative going transitions of the AC signal V.

The second integrating circuit 135 accepts the output signal of the second pulse generator 105 as a reset input which resets the second integrating circuit 135 in response to pulses received from the second pulse generator 105. The second integrating circuit 135 thus only integrates the AC signal V during the interval between positive going transitions of the AC signal V.

The sensing signal $V_{sen}$ is the difference between the magnitude of the integrated output signal on line 140 of the first integrating circuit 125 and the integrated output signal on line 145 of the second integrating circuit 135. The sensing signal $V_{sen}$ can be realized with a single output line, for example, by connecting two resistors of equal value between lines 140 and 145 and obtaining the difference signal at the junction between the two resistors. The sensing signal can then be referenced to the zero reference level, for example, ground or 0v.

Figure 3:
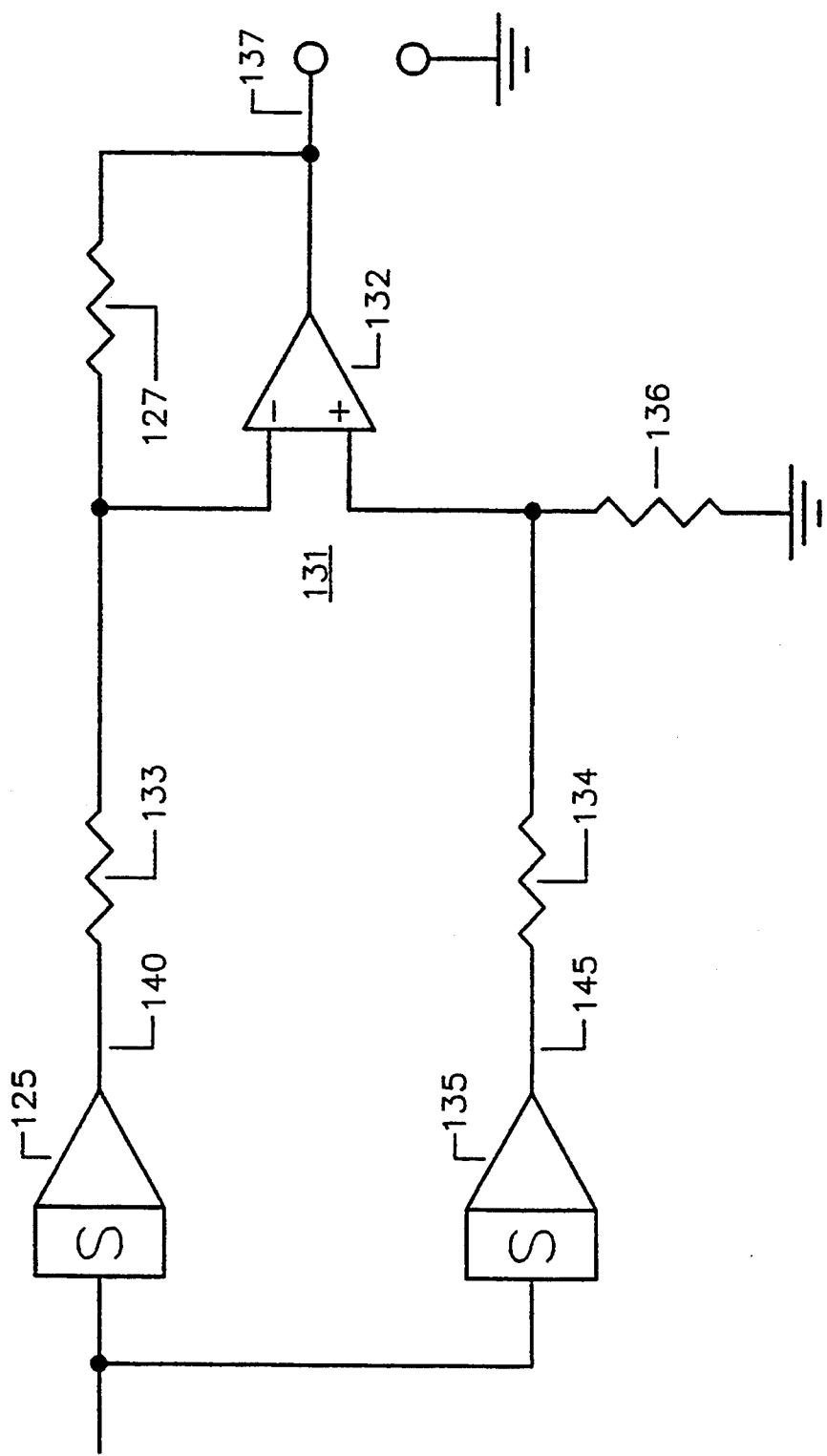
FIG. 3 is a schematic diagram of a circuit for converting the outputs of the integrating circuits into a sensing signal which is supplied on a single line and which is referenced to ground.

The sensing signal $V_{sen}$ can also be realized using the circuit of FIG. 3. As illustrated, a differential amplifier circuit 131 is utilized which is constructed from operational amplifier 132 and resistors 133, 134, and 136. The output of the first integrating circuit 125 at line 140 is supplied to the differential amplifier circuit 131 at resistor 133. The output of the second integrating circuit 135 at line 145 is supplied to the differential amplifier circuit 131 at resistor 134. (For the sake of clarity, the reset circuitry has not been shown in this figure). The sensing signal $V_{sen}$ is supplied at output 137 of the operational amplifier 132 and is referenced, for example, to ground (0v).

Figure 4:
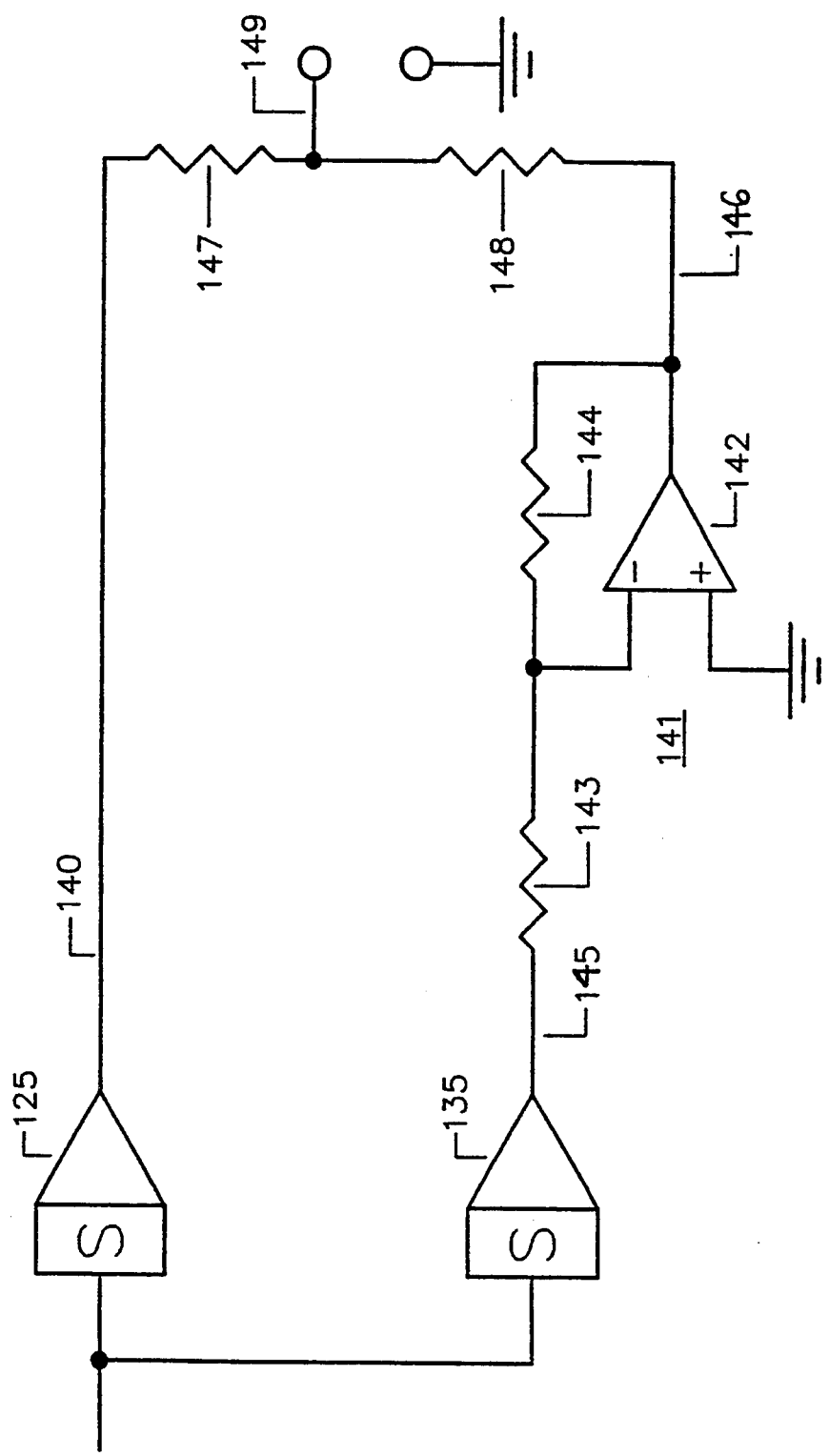
FIG. 4 is a schematic diagram of a further circuit for converting the outputs of the integrating circuits into a sensing signal which is supplied on a single line and which is referenced to ground.

A further alternative circuit for the realization of the sensing output is shown in FIG. 4. As illustrated, the output of the second integrating circuit 135 is supplied to an inverting circuit 141 constructed from operational amplifier 142 and resistors 143 and 144. The output of the inverting circuit 141 at line 146 and the output of the first integrating circuit 125 at line 140 are connected together by two resistors 147 and 148 of equal value. This results in a signal output at line 1149 which is referenced to ground and has a value equal to the average difference between the output signals of the first and second integrating circuits 125 and 135 at lines 140 and 145 (i.e. $V_{sen}/2$). As in FIG. 3, the reset circuitry has not been illustrated in FIG. 4 to preserve clarity.

Figure 5:
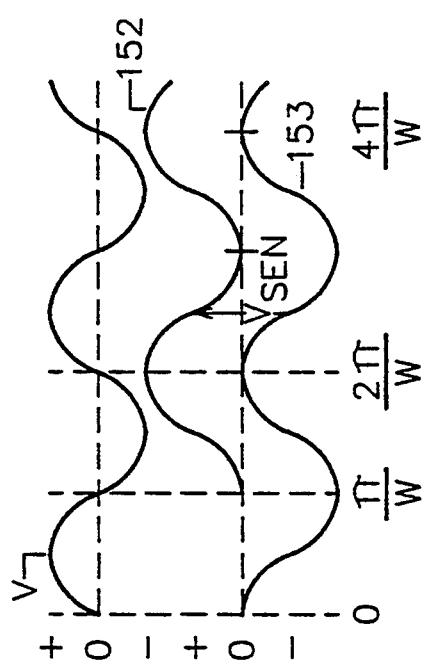
FIG. 5 is a graphical representation of an AC signal input to the embodiment of the invention shown in FIG. 2 and the resulting output signals from the integrators.

FIG. 5 is a graphical representation of the response of the embodiment of FIG. 2 to a typical sinusoidal AC signal input V. As illustrated, the AC signal input V is a sinusoidal waveform which may be represented by the following equation:

$$V = A \sin \omega t$$

where
V—the AC signal input
A = amplitude,
$\omega$ = frequency of the AC signal in radians/sec, and
t = the time in seconds.

The first integrating circuit 125, as a result of the resetting operation, is designed to have the following integrating characteristics:

$$V_{out1} = -K \int_{\pi/\omega}^{t} V \, dt$$

where
$V_{out1}$ = the output voltage from the first integrating circuit,
K = integration scaling factor,
$\omega$ = frequency of the AC signal V in radians/sec, and
t = the time in seconds.

The reset pulses from the first pulse generator 100 will reset the first integrating circuit 125 when the AC signal V undergoes negative going transitions from above the zero reference level, here 0v, to below the zero reference level. This corresponds to the time when t is equal to an odd multiple of $\pi/\omega$. This is illustrated by waveform 152.

The second integrating circuit 135 is designed to have the following integrating characteristics:

$$V_{out2} = -K \int_{0}^{t} V \, dt$$

where
$V_{out2}$ = the output voltage from the second integrating circuit,
K = integration scaling,
t = the time in seconds.

The reset pulses of the second pulse generator 105 will reset the second integrating circuit 135 when the AC signal V undergoes positive going transitions from below the zero reference level, here 0v, to above the zero reference level. This corresponds to the time when t is equal to an even multiple of $\pi/\omega$. This is illustrated by waveform 153.

Substituting the waveform V=A Sin ωt into the foregoing equations gives the following result:

$$V_{out1} = AK/\omega * (\cos \omega t - \cos \pi)$$

$$V_{out2} = AK/\omega * (\cos \omega t - \cos 0).$$

Using the difference between the integrated output signals as the sensing signal $V_{sen}$ results in the following:

$$V_{sen} = V_{out1} - V_{out2} = 2AK/\omega.$$

As a result, the sensing signal $V_{sen}$ is a DC signal which is directly proportional to the amplitude of the AC signal V and inversely proportional to the frequency of the AC signal V. The sensing signal $V_{sen}$ can thus be used to provide an accurate indication of the magnitude of the AC signal V where the frequency of the signal is generally constant. The sensing signal $V_{sen}$ can also be used, for example, in constant voltage to frequency ratio systems to provide an accurate indication of the frequency of the AC signal V where the magnitude of the AC signal V is generally constant. The resetting of the integrator circuits serves, inter alia, to avoid drift of the integrated signal outputs $V_{out1}$ and $V_{out2}$ due to, for example, circuit imperfections.

Figure 6:
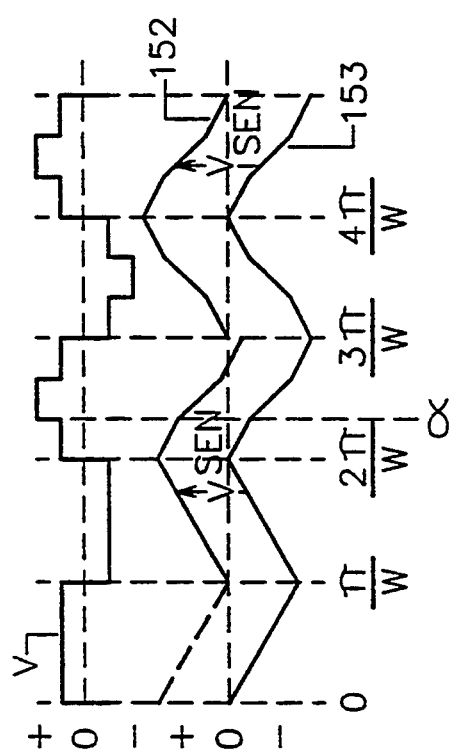
FIG. 6 is a graphical representation of a further AC signal input to the embodiment of the invention shown in FIG. 2 and the resulting output signals from the integrators.

FIG. 6 is a graphical representation of the response of the embodiment of FIG. 2 to a non-sinusoidal, generally periodic, AC signal input V. As illustrated, the AC signal input V is a square wave until time t=α at which time the signal V changes its characteristics. Two system characteristics are noted with the assistance of FIG. 6. First, the sensing signal $V_{sen}$ is a generally constant DC value despite the fact that the signal V is non-sinusoidal. Second, due to the reset of the integrator circuits 125 and 135, the sensing signal $V_{sen}$ correctly responds to the change in the input signal V within a half cycle time period thereby responding quickly to the change.

Figure 7:
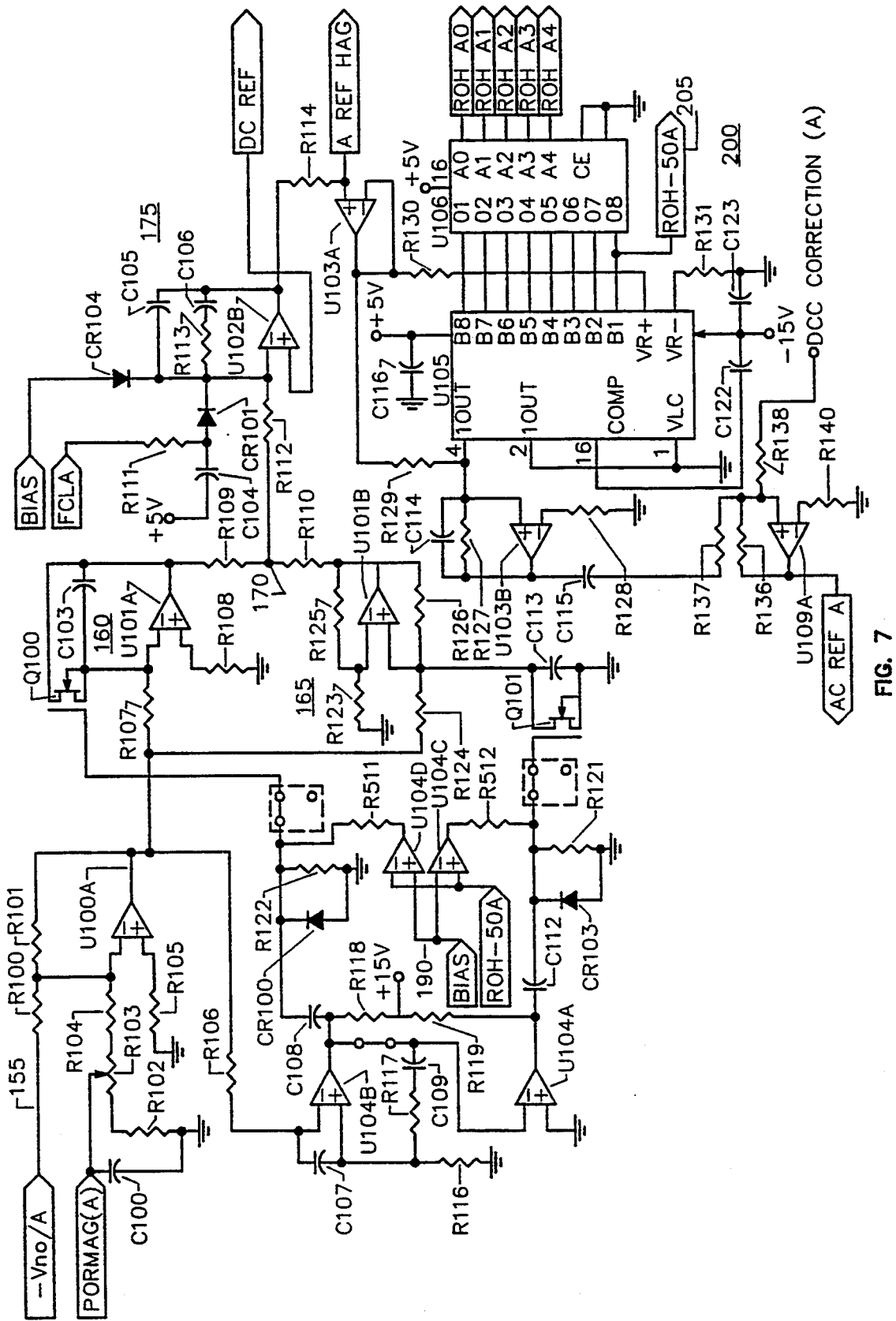
FIG. 7 is a schematic diagram of a detailed circuit embodying the present invention.
Figure 8:
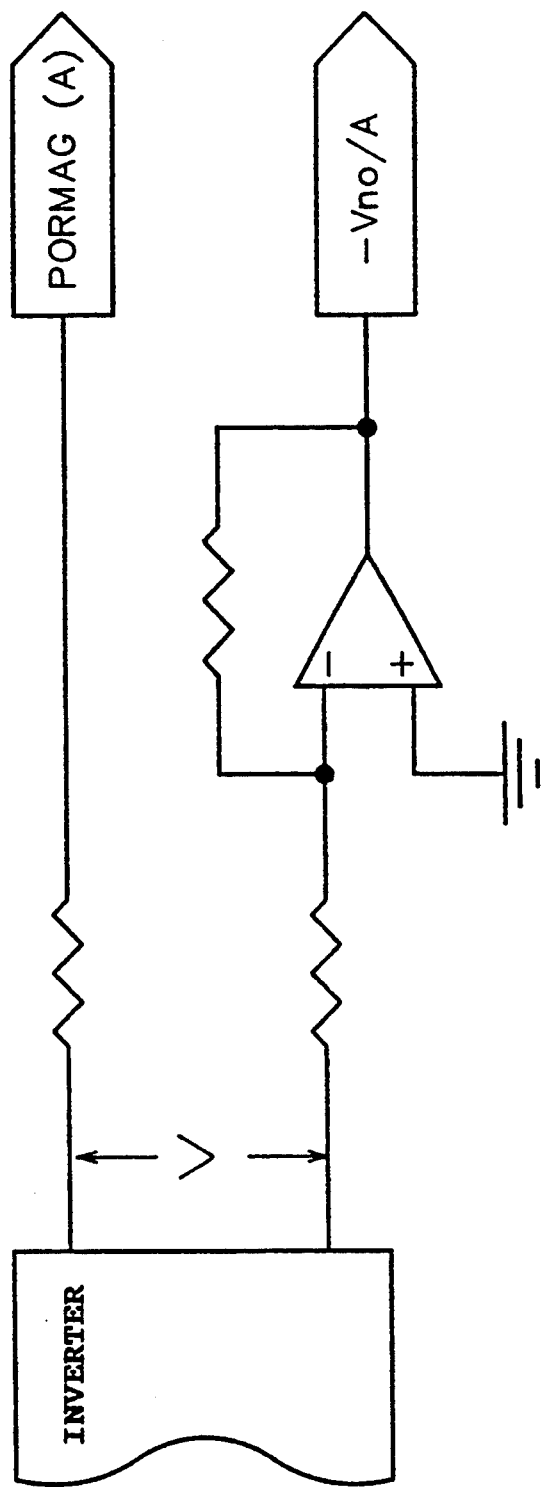
FIG. 8 is a schematic diagram of a circuit showing one embodiment of an interface between an invertor and the circuit shown in FIG. 7

FIG. 7 is a detailed schematic diagram of a sensing processor circuit. The circuit accepts an AC signal to be sensed at the input of operational amplifier 155 which inverts and scales the signal to a control level. An example of a circuit which may precede operational amplifier 155 is shown in FIG. 8. The output of amplifier 155 is supplied to an inverting integrator circuit 160 which includes operational amplifier U101A, capacitor C103, and resistors R107 and R108. A MOSFET transistor Q100 has its source and drain connected across capacitor C103.

The scaled AC signal is also supplied to a non-inverting integrator circuit 165 constructed from operational amplifier U101B, capacitor C113, and resistors R123, R124, R125, and R126. A MOSFET transistor Q101 has its source and drain connected across capacitor C113.

A comparator U104B accepts the scaled AC signal at its negative input terminal through resistor R106. The output of comparator U104B is supplied to the negative input terminal of comparator U104A.

Comparators U104A and U104B are used to generate reset pulses respectively through capacitors C112 and C108 to the gates of the MOSFETs Q101 and Q100 of the integrating circuits 165 and 160. The reset pulses discharge the capacitors C113 and C103 to reset the respective integrating circuits 160 and 165 at the proper time in accordance with the description of FIG. 2.

The output signals from the integrating circuits 160 and 165 are connected together by resistors R109 and R110 to form a difference signal by averaging the outputs of the inverting and non-inverting integrators at node 170. The difference signal is supplied to an error amplifier circuit 175 as the sensing signal.

FIG. 7 also illustrates certain optional circuits. For example, comparators U104C and U104D accept a bias signal at line 190 and a square wave at line 195 to inhibit pulses which might reset the wrong integrating circuit. The square wave is generated by circuit 200 at output 205 and has a frequency equal to the fundamental frequency of the AC input signal.

The following table sets forth the particular components and component values which may be employed in the embodiment shown in FIG. 7:

| Component | Value |
| --- | --- |
| U100, U101, U103, U109 | 1558S |
| U102 | LM158 |
| U104 | LM139 |
| U105 | DAC0800 |
| U106 | 825123 |
| R100, R101 | 17.4K |
| R102, R107, R108, R112 | 10K |
| R103, R128, R131 | 1K |
| R104, R109, R110, R127, R140 | 4.99K |
| R105 | 9.1K |
| R106 | 3.3K |
| R111 | 100 |
| R113, R116, R117 | 5.11K |
| R114 | 11K |
| R118, R119 | 4.7K |
| R121, R122, R511, R512 | 2.2K |
| R123, R124, R125, R126, R136, R138, R139 | 20K |
| R129 | 5.76K |
| R130 | 3.01K |
| C100 | 2200pf |
| C103, C113 | .039uf |
| C104, C106 | .22uf |
| C105, C106 | .001uf |
| C108, C112 | 820uf |
| C109 | 330pf |
| C111, C123 | .1uf |
| C114 | 10pf |
| C115 | 10uf |
| C122 | 82pf |
| CR100, CR101, CR103, CR104 | 1N4148 |
| Q101, Q102 | 2N6782 |

All integrated circuits, except U105 and U106 are powered from +15 V and −15 V supplies.

Although the foregoing embodiments of the sensing processor circuit have been described in the context of a PWM inverter system, the sensing processor circuit is subject to any number of applications. It is particularly suitable in any application in which an accurate sensing of the magnitude of a generally periodic, generally constant AC input signal is required. Alternatively, the sensing circuit may find application as a frequency monitor. For example, if a generally periodic, constant magnitude AC input signal is supplied to the present circuit, the magnitude of the sensing signal output will vary inversely with the frequency and thus provide an indication of the frequency of the AC signal. This feature may be exploited in constant voltage to frequency ratio systems.

While several embodiments of the invention have been described hereinabove, those of ordinary skill in the art will recognize that the embodiments may be modified and altered without departing from the central spirit and scope of the invention. Thus, the preferred embodiments are to be considered in all respects as illustrative and not restrictive, the scope of the invention being indicated by the appended claims rather than by the foregoing description. It is therefore the intention of the inventor to embrace herein all changes and modifications which come within the meaning and range of equivalency of the claims.

What is claimed is:

1. An apparatus for generating a sensing signal from a generally periodic AC signal, said AC signal having positive and negative transitions with respect to a zero level, said apparatus comprising:
   first means for supplying a first integrated signal by integrating said AC signal during a time period between said negative transitions of said AC signal;
   first reset means for resetting said first means for supplying during said negative transitions of said AC signal;
   second means for supplying a second integrated signal by integrating said AC signal during a time period between positive transitions of said AC signal;
   second reset means for resetting said second means for supplying during said positive transitions of said AC signal,
   said sensing signal being the difference in magnitude between said first and second integrated output signals.

2. An apparatus as claimed in claim 1 wherein said first and second integrated output signals are scaled by a negative valued scaling factor.

3. An apparatus as claimed in claim 1 wherein said AC signal has a generally constant frequency and wherein said sensing signal principally represents the magnitude of said AC signal.

4. An apparatus as claimed in claim 1 wherein said AC signal has a generally constant magnitude and wherein said sensing signal principally represents the frequency of said AC signal.

5. An apparatus as claimed in claim 1 wherein said first reset means comprises:
   a comparator for comparing said AC signal to said zero level and generating an output signal representative of said comparison;
   a pulse generator responsive to said output signal of said comparator for generating reset pulses to said first means for supplying during said negative transitions of said AC signal.

6. An apparatus as claimed in claim 5 wherein said first means for supplying comprises:
   an integrator circuit receiving said AC signal and having an output as said first integrated signal, said integrator circuit being reset in response to reset pulses from said pulse generator.

7. An apparatus as claimed in claim 6 wherein said second reset means comprises:
   a further pulse generator responsive to said output signal of said comparator for generating further reset pulses during said positive transitions of said AC signal.

8. An apparatus as claimed in claim 7 wherein said second means for supplying comprises:
   a further integrator circuit receiving said AC signal and having an output as said second integrated signal, said further integrator circuit being reset in response to said further reset pulses from said further reset means.

9. An apparatus as claimed in claim 1 and further comprising means for converting said first and second integrated signals into said sensing signal, said sensing signal being supplied on a single output line and being referenced to ground.

10. An apparatus as claimed in claim 9 wherein said means for converting comprises a differential amplifier circuit having a first input connected to receive said first integrated signal and a second input connected to receive said second integrated signal, said sensing signal being the difference between said first and second integrated signals.

11. An apparatus as claimed in claim 9 wherein said means for converting comprises:
   an inverter circuit connected to receive said second integrated signal and having an output representative of the inverse of said second integrated signal;
   a first resistor having a first terminal connected to receive said first integrated signal and a second terminal connected to a node;
   a second resistor having a first terminal connected to receive said output of said inverter circuit and a second terminal connected to said node;
   said single output line being connected to said node.

12. An apparatus as claimed in claim 9 wherein said sensing signal on said single output line is generally equal to the average of said first and second integrated signals.

13. A voltage-regulated pulse width modulated inverter system comprising:
   inverter means for converting a DC input signal into an AC output signal in response to at least one pulse width modulated switching signal input, said AC output signal having positive and negative transitions with respect to a zero level;
   PWM means for generating said pulse width modulated switching signal input to said inverter means in response to a sensing signal input;
   sensing means for generating said sensing signal input from said AC output signal of said inverter means, said sensing means including
   first means for generating a first integrated signal by integrating said AC signal during a time period between said negative transitions of said AC signal, said first means for generating being reset at said negative transitions of said AC signal, and
   second means for generating a second integrated signal by integrating said AC signal during a time period between positive transitions of said AC signal, said second means for generating being reset at said positive transitions of said AC signal, said sensing signal being the difference in magnitude between said first and second integrated output signals.

14. A voltage-regulated pulse width modulated inverter system as claimed in claim 13 wherein said first and second integrated output signals are scaled by a negative valued scaling factor.

15. A voltage-regulated pulse width modulated inverter system as claimed in claim 13 wherein said first means for generating comprises:
   reset means for generating reset pulses at negative transitions of said AC signal;
   an integrator circuit receiving said AC signal and having an output as said first integrated signal, said integrator circuit being reset in response to reset pulses from said reset means.

16. A voltage-regulated pulse width modulated inverter system as claimed in claim 15 wherein said reset means comprises:

a comparator for comparing said AC signal to said zero level and generating an output signal representative of said comparison; and a pulse generator responsive to said output signal of said comparator for generating said reset pulses.

17. A voltage-regulated pulse width modulated inverter system as claimed in claim 15 wherein said second means for generating comprises:

further reset means for generating further reset pulses at positive transitions of said AC signal;

a further integrator circuit receiving said AC signal and having an output as said second integrated signal, said further integrator circuit being reset in response to said further reset pulses from said further reset means.

18. A voltage-regulated pulse width modulated inverter system as claimed in claim 17 wherein said reset means and said further reset means comprise:

a common comparator for comparing said AC signal to said zero level and generating an output signal representative of said comparison;

a first pulse generator responsive to said output signal of said comparator for generating said reset pulses;

a second pulse generator responsive to said output signal of said comparator for generating said further reset pulses.

19. A voltage-regulated pulse width modulated inverter system as claimed in claim 13 wherein said PWM means comprises:

an error amplifier having a first input connected to receive said sensing signal input, a second input connected to receive a DC magnitude reference signal, and an output signal having a magnitude B;

a sine wave generator having a sine wave output signal;

a modulator circuit for multiplying said sine wave output signal of said sine wave generator by said output signal of said error amplifier, said modulator circuit having an output signal representing said multiplication;

a triangle wave generator having a triangle wave output signal;

a comparator having a first input connected to receive said output signal of said modulator circuit, a second input connected to receive said triangle wave output signal, and an output connected as said pulse width modulated switching signal input to said invertor means.

20. A voltage-regulated pulse width modulated inverter system as claimed in claim 13 wherein said sensing means comprises means for converting said first and second integrated signals into said sensing signal, said sensing signal being supplied on a single output line and being referenced to ground.

21. A voltage-regulated pulse width modulated inverter system as claimed in claim 20 wherein said means for converting comprises a differential amplifier circuit having a first input connected to receive said first integrated signal and a second input connected to receive said second integrated signal, said sensing signal being the difference between said first and second integrated signals.

22. A voltage-regulated pulse width modulated inverter system as claimed in claim 20 wherein said means for converting comprises:

an inverter circuit connected to receive said second integrated signal and having an output representative of the inverse of said second integrated signal;

a first resistor having a first terminal connected to receive said first integrated signal and a second terminal connected to a node;

a second resistor having a first terminal connected to receive said output of said inverter circuit and a second terminal connected to said node;

said single output line being connected to said node.

23. A method for generating a sensing signal from a generally periodic AC signal, said AC signal having positive and negative transitions with respect to a zero level, said method comprising the steps of:

generating a first integrated signal by integrating said AC signal during a time period between said negative transitions of said AC signal;

resetting said first integrated signal upon the occurrence of said negative transitions of said AC signal;

generating a second integrated signal by integrating said AC signal during a time period between positive transitions of said AC signal;

resetting said second integrated signal upon the occurrence of said positive transitions of said AC signal;

using the difference in magnitude between said first and second integrated output signals as said sensing signal.

24. A method as claimed in claim 23 and further comprising the step of scaling said first and second integrated output signals by a negative valued scaling factor.

25. A method as claimed in claim 23 and further comprising the step of using said sensing signal to indicate the magnitude of said AC signal.

26. A method as claimed in claim 23 and further comprising the step of using said sensing signal to indicate the frequency of said AC signal.

27. A method for generating an AC output signal from a DC input signal comprising the steps of:

converting a DC input signal into an AC output signal in response to at least one pulse width modulated switching signal input, said AC output signal having positive and negative transitions with respect to a zero level;

generating said pulse width modulated switching signal in response to a sensing signal input;

generating a first integrated signal by integrating said AC output signal during a time period between said negative transitions of said AC output signal;

resetting said first integrated signal upon the occurrence of said negative transitions of said AC output signal;

generating a second integrated signal by integrating said AC output signal during a time period between positive transitions of said AC output signal;

resetting said second integrated signal upon the occurrence of said positive transitions of said AC output signal;

using the difference in magnitude between said first and second integrated output signals as said sensing signal to control generation of said pulse width modulated switching signal.

28. A method as claimed in claim 27 and further comprising the step of scaling said first and second integrated output signals by a negative valued scaling factor.

* * * * *